(12) United States Patent
Hunter

(10) Patent No.: US 7,039,532 B2
(45) Date of Patent: May 2, 2006

(54) METHOD AND APPARATUS FOR READING AND CONTROLLING UTILITY CONSUMPTION

(76) Inventor: Robert R. Hunter, 111 Deerwood Rd., Suite 200, San Ramon, CA (US) 94583

( * ) Notice: Subject to any disclaimer, the term of this patent is extended or adjusted under 35 U.S.C. 154(b) by 129 days.

(21) Appl. No.: 10/683,928

(22) Filed: Oct. 10, 2003

(65) Prior Publication Data

US 2004/0078154 A1    Apr. 22, 2004

Related U.S. Application Data

(63) Continuation-in-part of application No. 10/615,572, filed on Jul. 8, 2003, which is a continuation-in-part of application No. 09/896,159, filed on Jun. 28, 2001, now Pat. No. 6,622,097.

(51) Int. Cl.
*G01R 12/06* (2006.01)
(52) U.S. Cl. .................................. 702/61; 340/3.1
(58) Field of Classification Search ............ 702/60–62, 702/64, 65, 79, 176–178, 187, 188; 361/111–115; 700/291; 324/142; 340/870.02, 3.1, 577, 340/70.39, 142
See application file for complete search history.

(56) References Cited

U.S. PATENT DOCUMENTS

| | | | |
|---|---|---|---|
| 4,132,981 A | | 1/1979 | White |
| 4,198,621 A | * | 4/1980 | Roper ................... 340/870.39 |
| 4,216,384 A | * | 8/1980 | Hurley ........................ 307/39 |
| 4,327,362 A | | 4/1982 | Hoss |
| 4,350,980 A | | 9/1982 | Ward |
| 4,390,876 A | | 6/1983 | Bjorklund |
| 4,463,354 A | | 7/1984 | Sears |
| 4,646,084 A | | 2/1987 | Burrowes et al. |
| 4,652,877 A | | 3/1987 | Gray |
| 4,680,704 A | | 7/1987 | Konicek et al. |
| 4,707,852 A | | 11/1987 | Jahr et al. |
| 4,747,041 A | | 5/1988 | Engel et al. |
| 4,758,836 A | | 7/1988 | Scuilli |
| 4,782,341 A | | 11/1988 | Gray |

(Continued)

FOREIGN PATENT DOCUMENTS

EP    0 967 766 A2    12/1999

(Continued)

OTHER PUBLICATIONS

Residential energy management tool from Invensys designed to help reduce demand, need for new generation, Only the first page of this article was available for download, [online] Retrieved from the internet: <URL:http://www.invensysnetworks.com/News/pdf/AMRReport.pdf>, Appearing on the document is the date of Mar. 14, 2002.

(Continued)

*Primary Examiner*—Marc S. Hoff
*Assistant Examiner*—Mohamed Charioui

(57) ABSTRACT

A method and system for controlling electric power consumption using a computer to create a forecast and then controlling devices that use power based on the forecast. An automatic reader device is used to gather power consumption data from a point of utility service. The power consumption data is then provided to a computer. The computer is used to create a forecast of energy use for instantaneous demand and time-based usage. The computer then provides alerts based on the forecast for the manual or automatic control of devices that consume electricity. The system may be managed locally or remotely by a computer, PDA, cell phone or other network enabled device.

37 Claims, 7 Drawing Sheets

U.S. PATENT DOCUMENTS

| | | | |
|---|---|---|---|
| 4,783,623 A | 11/1988 | Edwards et al. |
| 4,792,677 A | 12/1988 | Edwards et al. |
| 4,803,632 A | 2/1989 | Frew et al. |
| 4,833,618 A | 5/1989 | Verma et al. |
| 4,881,070 A | 11/1989 | Burrowes et al. |
| 4,884,021 A | 11/1989 | Hammond et al. |
| 4,939,728 A | 7/1990 | Markkula, Jr. et al. |
| 4,987,363 A | 1/1991 | Gibbs et al. |
| 5,002,226 A | 3/1991 | Nelson |
| 5,086,385 A | 2/1992 | Launey et al. |
| 5,111,407 A | 5/1992 | Galpern |
| 5,140,351 A | 8/1992 | Garcia et al. |
| 5,152,075 A * | 10/1992 | Bonar .......................... 34/250 |
| 5,214,587 A | 5/1993 | Green |
| 5,252,967 A | 10/1993 | Brennan et al. |
| 5,270,704 A | 12/1993 | Sosa Quintana et al. |
| 5,278,551 A | 1/1994 | Wakatsuki et al. |
| 5,298,894 A | 3/1994 | Cerny et al. |
| 5,333,183 A | 7/1994 | Herbert |
| 5,446,677 A | 8/1995 | Jensen et al. |
| 5,493,287 A | 2/1996 | Bane |
| 5,495,239 A | 2/1996 | Ouellette |
| 5,506,404 A | 4/1996 | Milan-Kamski |
| 5,511,188 A | 4/1996 | Pascucci et al. |
| 5,522,044 A | 5/1996 | Pascucci et al. |
| 5,523,751 A | 6/1996 | Byford et al. |
| 5,541,589 A | 7/1996 | Delaney |
| 5,550,988 A | 8/1996 | Sarangdhar et al. |
| 5,553,609 A | 9/1996 | Chen et al. |
| 5,555,195 A | 9/1996 | Jensen et al. |
| 5,559,894 A | 9/1996 | Lubliner et al. |
| 5,572,438 A | 11/1996 | Ehlers et al. |
| 5,589,764 A | 12/1996 | Lee |
| 5,602,744 A | 2/1997 | Meek et al. |
| 5,619,192 A | 4/1997 | Ayala |
| 5,669,276 A | 9/1997 | Spacek |
| 5,678,042 A | 10/1997 | Pisello et al. |
| 5,684,710 A | 11/1997 | Ehlers et al. |
| 5,684,826 A | 11/1997 | Ratner |
| 5,696,695 A | 12/1997 | Ehlers et al. |
| 5,699,276 A | 12/1997 | Roos |
| 5,721,659 A * | 2/1998 | Young ......................... 361/111 |
| 5,721,934 A * | 2/1998 | Scheurich ................... 713/320 |
| 5,742,762 A | 4/1998 | Scholl et al. |
| RE35,793 E * | 5/1998 | Halpern ........................ 702/62 |
| 5,767,790 A | 6/1998 | Jovellana |
| 5,804,802 A | 9/1998 | Card et al. |
| 5,805,458 A * | 9/1998 | McNamara et al. .......... 702/60 |
| 5,808,558 A | 9/1998 | Meek et al. |
| 5,852,658 A | 12/1998 | Knight et al. |
| 5,880,464 A | 3/1999 | Vrionis |
| 5,880,677 A * | 3/1999 | Lestician .................... 340/3.1 |
| 5,913,036 A | 6/1999 | Brownmiller et al. |
| 5,924,486 A | 7/1999 | Ehlers et al. |
| 5,968,176 A | 10/1999 | Nessett et al. |
| 6,012,152 A | 1/2000 | Douik et al. |
| 6,087,959 A | 7/2000 | Glorioso |
| 6,098,893 A | 8/2000 | Berglund et al. |
| 6,118,269 A | 9/2000 | Davis |
| 6,134,655 A | 10/2000 | Davis |
| 6,167,389 A | 12/2000 | Davis et al. |
| 6,178,362 B1 | 1/2001 | Woolard et al. |
| 6,181,257 B1 | 1/2001 | Meek et al. |
| 6,215,404 B1 * | 4/2001 | Morales ....................... 340/577 |
| 6,216,956 B1 | 4/2001 | Ehlers et al. |
| 6,226,600 B1 * | 5/2001 | Rodenberg et al. ........... 702/61 |
| 6,262,672 B1 | 7/2001 | Brooksby et al. |
| 6,301,674 B1 * | 10/2001 | Saito et al. .................. 713/340 |
| 6,311,105 B1 * | 10/2001 | Budike, Jr. .................. 700/291 |
| 6,351,693 B1 | 2/2002 | Monie et al. |
| 6,362,745 B1 | 3/2002 | Davis |
| 6,363,422 B1 | 3/2002 | Hunter et al. |
| 6,369,719 B1 | 4/2002 | Tracy et al. |
| 6,429,642 B1 | 8/2002 | Rodilla |
| 6,476,728 B1 * | 11/2002 | Sakakibara ............. 340/870.02 |
| 6,483,291 B1 * | 11/2002 | Bhateja et al. ............... 324/142 |
| 6,542,791 B1 | 4/2003 | Perez |
| 6,574,104 B1 | 6/2003 | Patel et al. |
| 6,577,962 B1 | 6/2003 | Afshari |
| 6,618,709 B1 | 9/2003 | Sneeringer |
| 6,619,055 B1 | 9/2003 | Addy |
| 6,622,097 B1 | 9/2003 | Hunter |
| 6,636,893 B1 | 10/2003 | Fong |
| 6,639,893 B1 | 10/2003 | Chikenji et al. |
| 6,728,646 B1 | 4/2004 | Howell et al. |
| 6,747,571 B1 | 6/2004 | Fierro et al. |
| 6,772,052 B1 * | 8/2004 | Amundsén et al. ......... 700/291 |
| 6,816,811 B1 * | 11/2004 | Seem ........................... 702/179 |
| 6,828,695 B1 * | 12/2004 | Hansen ......................... 307/31 |
| 2002/0095269 A1 * | 7/2002 | Natalini et al. ............. 702/188 |

FOREIGN PATENT DOCUMENTS

| | | |
|---|---|---|
| WO | WO-03/003029 A3 | 1/2003 |

OTHER PUBLICATIONS

Comcast, Invensys join PECO in demand-side management trial, Only the first page of this article was available for download, [online] Retrieved from the internet: <URL:http://www.energylibrary.com/file_display_freesummary.cfm?id=1177&freesummary=1&app_id=21>, Appearing on the document is the date of Sep., 2003.

R. Levy, New Principles for Demand Response Planning, EP-P6035/C3047, EPRI, Palo Alto, CA, Mar. 2002.

Gulf Power, Price Responsive Load Management, web site viewed on or about Jun. 17, 2003, actual publication date unknown, Gulf Power, Atlanta, GA. <http://www.energy.ca.gov/peakload/documents/2002-03-15_presentations/ 2002-03-15_gulfpower.ppt>.

* cited by examiner

METHOD AND APPARATUS FOR READING AND CONTROLLING UTILITY CONSUMPTION

This application is a continuation-in-part of prior application Ser. No. 10/615,572, filed Jul. 8, 2003, which is a continuation-in-part of application Ser. No. 09/896,159, filed Jun. 28, 2001, now U.S. Pat. No. 6,622,097. The entire contents of application Ser. No. 10/615,572 and of U.S. Pat. No. 6,622,097 are hereby incorporated by reference.

BACKGROUND OF THE INVENTION

There are various types of electrical power monitoring devices on the market today. These include a number of units which operate as an automatic meter reading (AMR) device or which work in conjunction with an AMR device. Such devices were typically developed as a cost saving method for the collection of data for electrical service providers but have provided little usability to the consumer. In cases where consumers have been given some features through AMR systems, there has not been an ability to reliably monitor and control power use while maintaining a comfortable environment.

Controlling the amount of electricity use is advantageous both for the electric utility provider and for the consumer. The utility company can avoid building costly new power plan ts and consumers can avoid excess power costs. In order for proper control to be facilitated, however, it must be done in a manner that provides a comfortable environment for the user. In the present invention, a means and device are shown that provide monitoring and control of power consumption in a manner that may be used by and provide benefit to both the utility service provider and the user.

A number of methods and systems exist for the monitoring or control of electric power. In U.S. Pat. No. 5,589,764, Lee shows a system for measuring the amount of power use for an individual device. While such an invention is useful to measure segments of power use, for example, washer, dryer, air conditioning, heating, etc, it does little to give a user the ability to understand their total power consumption and their usage patterns. Further it provides no means cohesively view multiple devices or multiple locations.

In U.S. Pat. No. 6,618,707, Sneeringer shows a method of monitoring multiple locations in a global fashion. By monitoring complete facilities such a whole houses or buildings, a user is able to see their power consumption. Further, as a global method, a utility company may view aggregate amounts of power consumption from multiple locations. However, no control means are shown as a way to reduce actual power consumption to the user's and provider's mutual benefit.

In U.S. Pat. No. 6,542,791 Perez shows a system that provides control of power use by the utility provider. However, this system does not allow control by a user and may allow the utility to take actions unwise to the user's condition. For example it may allow the utility to turn off air conditioning when vitally necessary. Further, the system does not provide direct feed back to the user for their benefit.

Similarly, U.S. Pat. No. 6,167,389, Davis et. al. shows a system that provides utility service providers with the ability to prevent overloading a grid when controlling power consumption of remote users. This system does little to provide feedback to a consumer and contains no ability to take actions based on dynamic events.

In U.S. Pat. No. 6,429,642 Rodilla Sala shows a system that provides utility consumers with a certain form of usage control. However, this system uses a single set point for instantaneous or time-based usage control. As such, when that limit is reached, the system must take an action, assumedly, to shut off power. Thus the system provides a management function but only at the point when a single target amount of usage is reached. Once that target amount is reached, the system reacts to that singular event. Thus system does not provide continuous management in order to achieve a target, nor does it do so while maintaining a comfortable environment.

SUMMARY OF THE INVENTION

The present invention provides a means for control of electrical power use by both user and supplier alike in a manner which is beneficial to both. The system gathers electrical use data from an automatic reader placed at an electrical service point. The system then gathers data into computer memory for processing.

A forecast of consumption is computed on a computer for a predetermined period of time, for example; today, each weekday, peak-cost periods, summer, etc. On the basis of the forecast, one or more devices or locations which consume power are controlled to enable the user to reach one or more energy targets while maintaining an acceptable environment.

A graphical representation is made of the actual use and forecast amounts so as to indicate to the user, in a visual means, the present status of use and forecast amounts. For example, information may be arranged in three graphs that are analogous to information common to automobile travel. These include the real-time rate-of-use, comparable to the speedometer of an automobile. This graph tells the user their consumption rate on an instantaneous basis at the present moment. The second graph, a time-segment-based graph for displaying quantity vs. time data, is comparable to the trip odometer. This graph shows the user their consumption on a day-to-date, daily, month-to-date, or other calendar-based time basis. It may also display utility or other time-based segments such as peak period, summer, Mondays, etc. The final graph is comparable to the general odometer. It may show the total energy consumption for the year-to-date or through the life of the system. Each graph can be displayed in units of measurement as desired, for example, kilowatt hours for usage quantity or currency for cost. By presenting this data in three logical and understandable formats, data can be displayed to show whether the user will be under his specified usage or cost level of consumption. Such forecasts are commonly used by trip computers in automobiles to tell the consumer whether they should adjust their speed to reduce fuel consumption, when they will arrive at their destination based upon present and average speed, and how many miles they have to go to complete their trip.

In the present invention, if the calculated forecast indicates that the present usage rate will cause that consumer to exceed a predetermined target unit or cost level, a signal is provided by the computer to allow for the manual or automatic control of power-consuming devices to assure that the power use falls at or below the specified requirement. This is especially advantageous during energy crisis situations. A forecast rate for use may be shown as a red colored line graph. A second line, the baseline target consumption, may be displayed as a blue line graph. If a user is under their baseline target amount for the period in question, the area under the forecast line graph may show as green. If the user is averaging over the baseline amount for the period in question, the area for that particular graph may show as a red. For example, if the consumer is averaging a rate of consumption use that will exceed the daily baseline level if continued for the rest of the cycle, the area above the baseline would show as red. In this way the consumer and utility can always be aware of the power-use status to achieve baseline levels for the hour, day, and month or any time segment used by a utility or chosen by the consumer.

Further, the consumer or utility may program the computer to automatically control the rate of utility-based consumption based on the forecast. In an automatically controlled system, graphs may be used as well for visual feedback. This is advantageous because in an automatically controlled system a red area on a graph may indicate that control operations are between sequences or that control operations are failing, thus an alert could be sent. A number of commonly available products accept control commands and allow for the facilitating of automatic control. Such devices include thermostats, lighting, dimmers, appliances, valves and other items. Thus, the computer may control such devices through automatic commands to, for example, adjust the thermostat on an air conditioning unit in response to the forecast. In addition, a communication system, such as the Internet, can also be utilized to allow the computer to communicate to the utility company, the consumer and third parties for access and management of consumption from a remote computer, PDA, cell phone or other network connected device.

BRIEF DESCRIPTION OF THE DRAWINGS

The present invention will now be described in more detail with reference to preferred embodiments of the invention, given only by way of example, and illustrated in the accompanying drawings in which.

DETAILED DESCRIPTION

Figure 1:
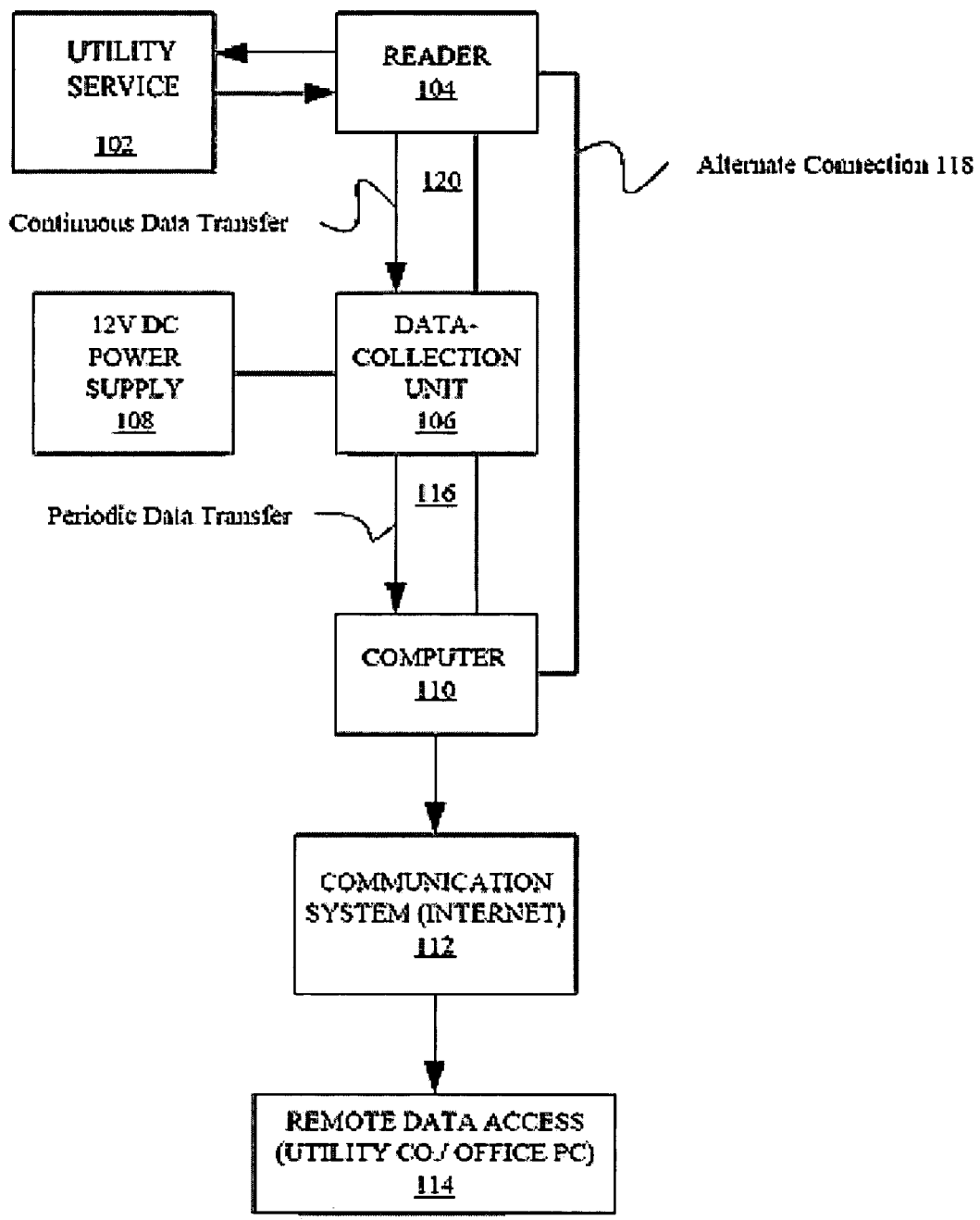
FIG. 1 illustrates a block schematic diagram of an apparatus for reading and managing power consumption in accordance with the present invention.

FIG. 1 illustrates a block schematic diagram of an apparatus 100' for reading and managing power consumption in accordance with the present invention. As shown in FIG. 1, a reader 104 is attached to a typical utility service point, 102 such as an electrical panel commonly found on homes, apartment buildings and commercial buildings. The reader 104 provides a means for automatically reading power. The data generated by the reader 104 may be continuously transferred through a connection such as a serial cable 120, to a data collection unit 106 or alternatively directly to the monitoring device 110, such as a computer.

The data collector 106 is therefore optional. When provided, the data collection unit stores data generated by the reader 104. The data collection unit 106 may store data for a limited time when the monitoring device (computer) 110 is shut off or in the event of a power failure. With appropriate memory, the unit 106 may be able to store data for up to a year. The preferred embodiment of the data-collection unit 106 may include a single input port interface for the reader 104, such as a RJ-11 or RJ-45 port. The reader 104 also contains a single serial port out, to the computer 110, such as a DB-9. The preferred data-collection unit 106 is approximately 2" wide and 3" long and includes a 12 volt power supply, such as from a wall mounted AC to DC converter 108. A battery, such as a standard watch battery, may be provided for backup. Further, the data collection unit 106 may be powered by the serial driver of one pin on the serial port of the computer. The preferred data-collection unit 106 includes a microprocessor such as a PIK Microprocessor including non-volatile memory and a timer crystal. It will be apparent that any microprocessor or controller could be used.

In a preferred application of the invention where multiple power meters are monitored, such as an apartment building or a commercial building, multiple reader inputs may be provided in a single data collector unit 106. For example, the data collection unit 106 may be provided with inputs for additional readers 104, such as four to eight inputs and an optional Ethernet connector for networking to a single monitoring device 110.

The preferred embodiment of the monitoring device 110 may be a conventional general-purpose computer system or an embedded computer containing one or more input/output ports and need not be specific to this application. Thus, as an embedded computer, it may also be a microprocessor embedded into an energy consuming device such as an air conditioning unit, an energy controlling device, such as a thermostat or an energy distribution devices, such as an Uninterruptible Power Supply (UPS). The computer 110 need not be dedicated solely to the purpose of this invention. It may, for example, also run another functional program such as general building management or control tasks. The computer 110 may also be a simple microprocessor.

When receiving information direct from the reader 104, the monitoring device 110 receives the data through a direct path connection 118, which may be a wired connection such as a serial cable. When the data collection unit 106 is employed, it transfers data to the computer 110 via a direct path connection which may also be a wired connection such as a serial or Ethernet connection. The monitoring device 110 will not lose information during power failure as it stored its data in non-volatile memory and real-time data is only gathered when power is present and being consumed. In addition, when employed, the data collector 106 will not lose its data during an outage because it holds historic values in non-volatile memory and real-time data is only gathered when power is present and, thus, being consumed.

The monitoring device 110 may be connected to a communication system 112 or network, such as the Internet to allow remote access 114 of the data. For example, a utility company may obtain the data for billing purposes or by the end-user who wants to control his power consumption from his PDA or computer from a remote location, such as his office.

Figure 2:
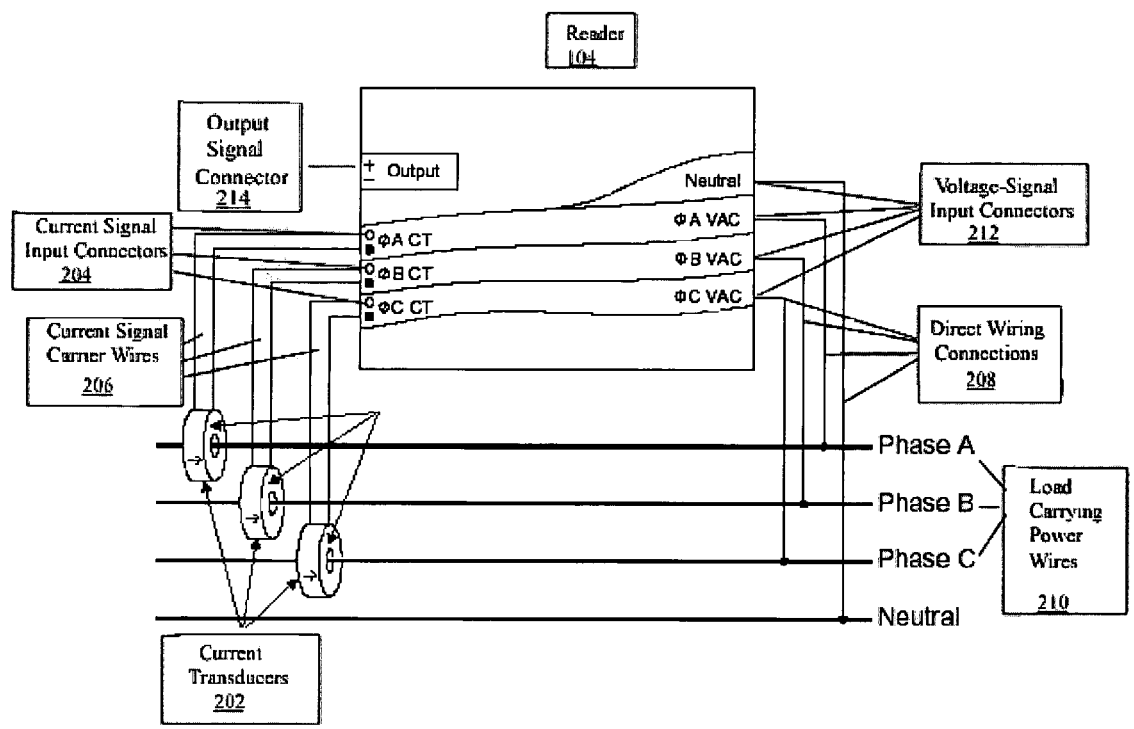
FIG. 2 illustrates the preferred embodiment of the reader for gathering data on electricity use.

FIG. 2 illustrates an embodiment of the reader 104. The reader 104, in a preferred embodiment, is an EnerSure Model 1 from TrendPoint Systems. The reader 104 is connected to one or more current transducers 202 to measure the amount of current, or amperage, flowing through a wire. The current transducers-202 are connected around the load-carrying power wires 210 which bring utility power into a facility. When wrapped around the load-carrying wires 210, a signal is transduced from the within the current transducer 202 and carried to the current input signal connectors 204 on the reader 104. The transducers 202 have their signals carried to the current signal connectors 204, via the current signal carrier wires 206. The reader 104 may also include direct wiring connections 206 to the voltage source that is being monitored 210. The direct wiring connections 208 to the voltage load-carrying power wires 210 carry the voltage signal directly to the voltage signal input connectors 212.

The reader 104 may calculate energy use purely as a function of amperage and amperage hours. When calculating amperage and amperage hours, no direct voltage connection need be made. The reader may also calculate energy use on the basis of kilovolts and kilovolt hours. The reader may further calculate energy use on the basis of watts and watthours. When calculating kilovolts and watts, a connection to the voltage source needs to be made. In the preferred embodiment, the reader 104 then provides a pulse output from the output connector 214. This pulse output is in direct proportion to the number of watts and watt-hours having been registered in the reader 104. In an alternative embodiment, the output connector 214 may also provide a wireless pulse signal. In another alternative embodiment, the output connector 214 may provide a powerline carrier signal. In still another embodiment, the reader may provide a serial output signal. Alternatively, in still another embodiment, the output connector 212 may provide an Ethernet signal. Thus, it may be seen that the data may be sent directly to the computer 110 and that the collection unit 106 is therefore optional.

Figure 3:
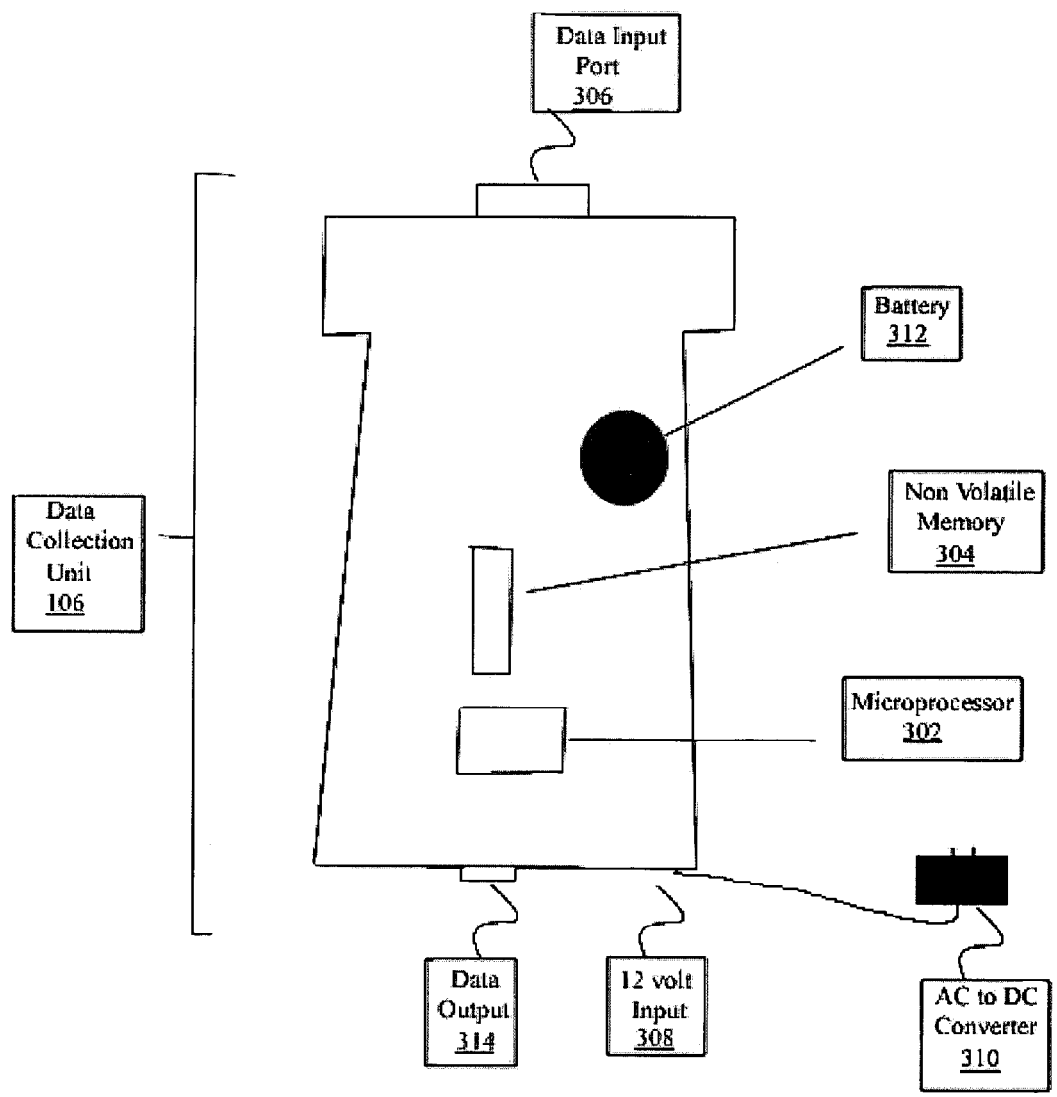
FIG. 3 illustrates the preferred data collection unit for gathering data from the reader, converting it into usable data to a computer and transferring that data to the computer.

FIG. 3 illustrates the data collection unit 106. The preferred embodiment of the data collection unit is the EnerSure Data Collection Module from TrendPoint Systems. The reader 104 may send its information directly to the computer 110, thus the data collector 106 is optional. When provided, the data collection unit stores data generated by the reader 104. The data collection unit 106 may store data in non-volatile memory 304 when the monitoring device (computer) 110 is shut off or not communicating. With appropriate memory, the unit 106 may be able to store data in the non-volatile memory 304 for up to a year. The preferred embodiment of the data-collection unit 106 may include a data input port 306 to receive the pulse signals provide by the reader 104. In an alternative embodiment, should the reader 104 be a unit other than the TrendPoint EnerSure Data Gathering Module, the data collection unit 106 may have an input serial port configured as an RS-232 or RS-485 port or other input medium. Thus, the reader 104 is not specific to the system and another commercially available or custom-built reader 104 may be used. The preferred data-collection unit 106 is approximately 2" wide and 3" long and includes a 12 volt input 308, such as from a wall mounted AC to DC converter 310. A battery, 312, such as a standard watch battery, may be provided for backup. Further, the data collection unit 106 may be powered by the serial driver of the serial port of the computer 110. The preferred data-collection unit 106 includes a microprocessor 302, such as a PIK Microprocessor and a data output port 314. The output port may be a serial, Ethernet wired or wireless port. It will be apparent that any microprocessor or controller could be used for this purpose. Thus, the data collection unit 106 is not only optional but another unit of comparable function from another supplier may be substituted, when the data collection unit 106 is to be employed.

Figure 4:
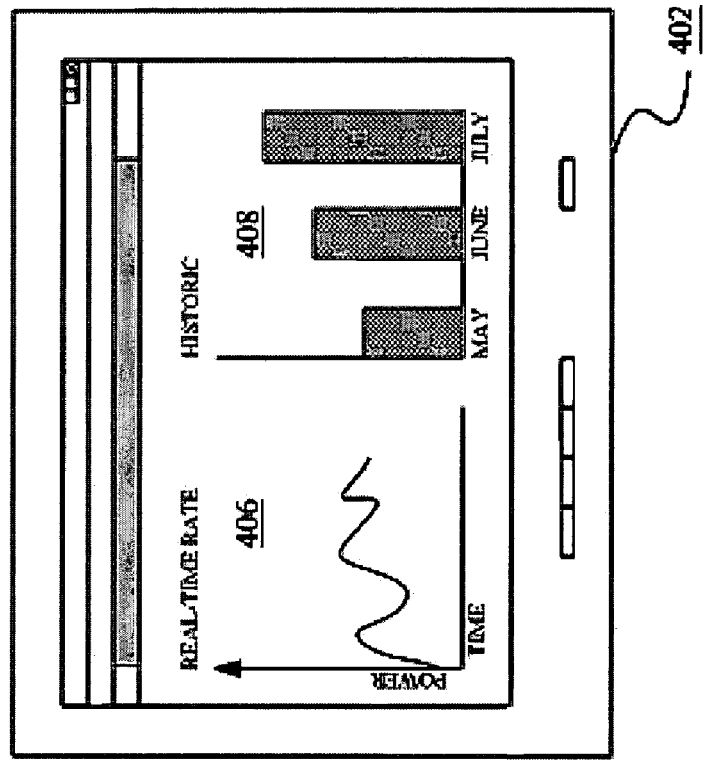
FIG. 4 illustrates a user interface displayed on the screen of the computer.
Figure 4:
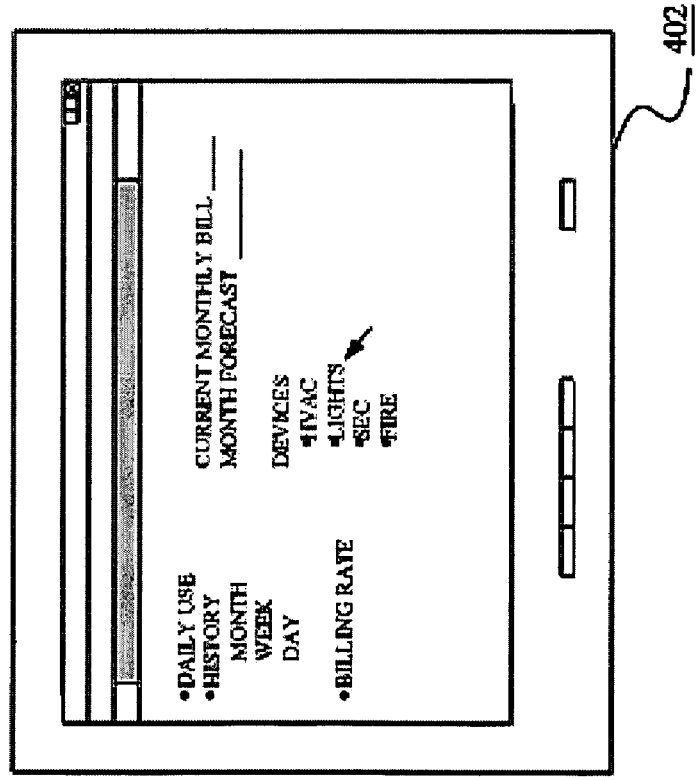

FIG. 4 illustrates a user interface displayed on the screen of the computer 110 (FIG. 1). As Illustrated in FIG. 4, the computer 110 may provide a central location for the end-user to remotely connect to or use directly to view the data collected by the reader 104. Software stored in the computer 110 memory causes the computer 1110 to compile counted intervals from the reader. The software may be compliant to all automatic meter reading devices, and therefore might not be specific to the aforementioned reader 104. In addition, the software may incorporate an adjustable architecture to optimize for various sizes and complexities fitting to the end-user's need.

An interface 402 such as web-based interface (e.g. a browser or web-based spreadsheet) allows the end-user to monitor the information relating to power consumption. If the interface 402 is a browser, it may for example, render all graphic data as line or bar graphs 408 using Macromedia Corporation's Flash program. By choosing to render data via flash, the vast majority of the program overhead for rendering the interface 402 is handled directly in the browser of the computer used to display the interface 402. Thus, the computer 110 may be an inexpensive device such as a serial server, embedded computing device, or other device which contains one or more input/output connections. Because an end user might want to view real-time, daily or monthly bar graphs 408 of power consumption, Macromedia Flash provides the ability to present real-time moving graphs or pictures. This might be utilized when providing real-time power consumption rate 406 such as a line graph or chart depicting power usage over time or up-to-date/cost per billing cycle costs. In addition the interface 402 may provide other data such as peak demand rate including date and time of the peak demand. The interface 402 may be structured in automobile-familiar methods for ease of use and so that an end-user need not require special training or skills for use.

In addition, a spreadsheet with web-based query capabilities may also be used to allow users to both view live and historical data and save data to files for later review. Using Microsoft Excel's remote web-query feature also allows the user to manipulate power data by creating custom time intervals and other valuable methods to view all data.

Figure 5:
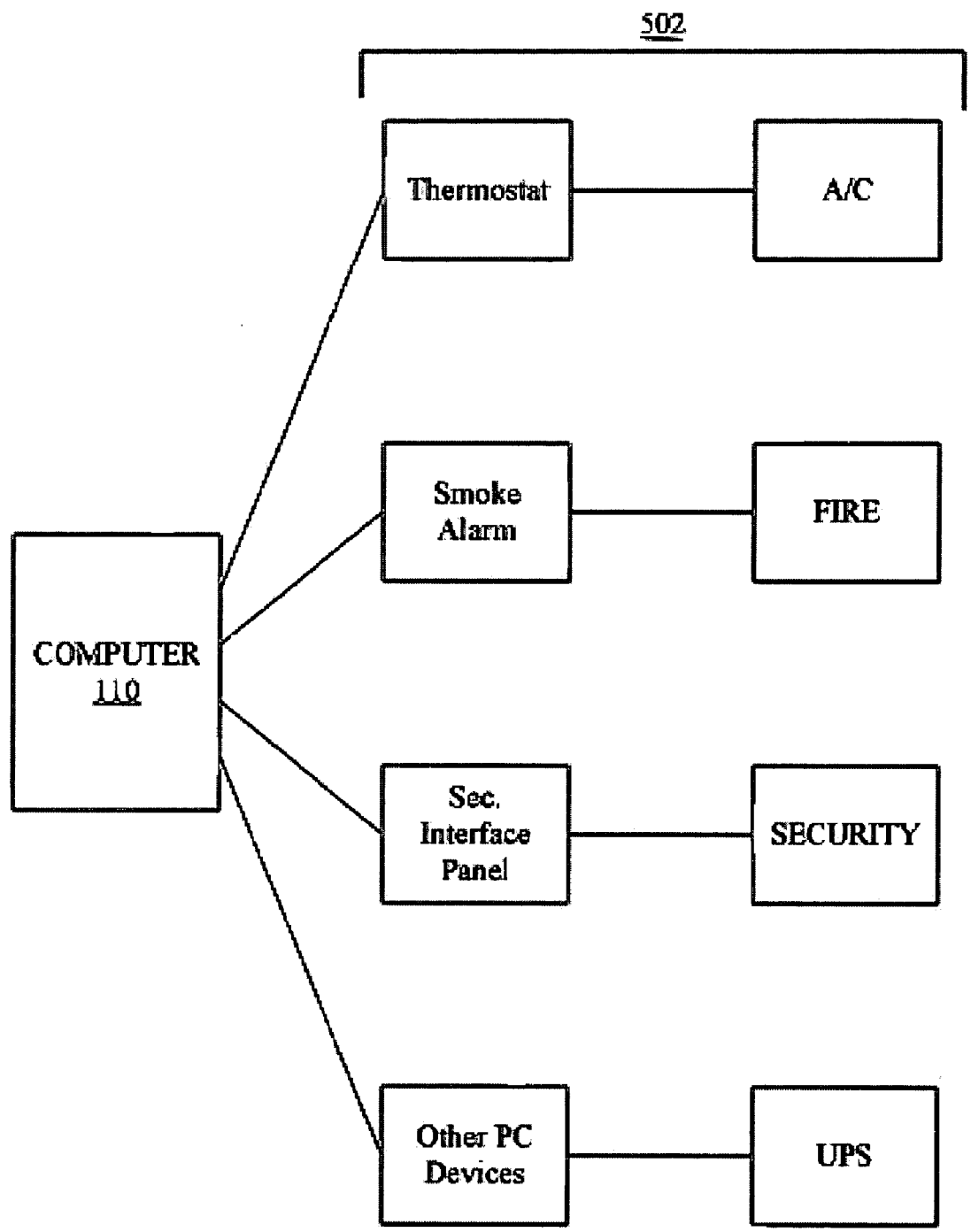
FIG. 5 is an illustration of the computer connected to power consuming device through a serial port or Ethernet interface of the computer.

Illustrated in FIG. 5 are devices 502 such as Heating Ventilation Air Condition (HVAC) systems and other power consuming devices that may be connected to the computer 110 through a serial port or Ethernet interface of the computer 110. The interface 402 may provide the end-user with information on what devices are being currently used, the rate of power consumption the device operates at, and the ability to control these devices based on measured consumption. Therefore, allowing the end-user to manage the rate of consumption for that household.

The ability to manage the rate of consumption may be especially advantageous when dealing with utility companies that use peak or penalty-level billing systems. In a peak-level billing system, a customer is charged on the basis of peak and non-peak time-based-usage with peak time usage being much higher than non peak. In a penalty-level billing system, if a customer exceeds a predetermined level of power consumption or baseline level, then the utility company may charge a premium rate for the power consumed above the baseline. Some utility companies may also provide rebates on future bills when a customer falls below a predetermined level of usage for a given peak or penalty period.

The interface 402 may provide a forecast based on a real-time rate of consumption to determine whether the end-user will be under his target utility usage level of consumption or other predetermined level. The forecast may be computed by taking historical and real-time data and computing a forecast based on that data for any time segment. For example, data can be gathered and used to forecast chronological time segments such as total daily, weekly and monthly use. Data may also be gathered and used to forecast non-chronological time segments such as Mondays, Peak-Time periods, Summer Off-Peak periods, etc. In an example of a chronological time period, the average power consumption used per day thus far in the current billing cycle may be used. This number is then multiplied by the number of days in a billing cycle to create a billing cycle forecast of usage. So, for example, if the customer was on day 5, the forecast will divide the total power usage at that time by 5 to compute a daily average and then multiply the daily average by the number of days in the billing cycle. In an example of a non-chronological time period, past usage for each Monday during the summer may be used to compute a forecast for the present Monday's power use. A real-time adjustment to the forecast may be made as the present Monday progresses in time. Thus, a new forecast may be computed continuously based upon present and historical usage. If the forecast indicates that the usage will exceed the baseline level a user may control the power usage of end-use devices from the computer 110 to fall below this requirement, especially during power crisis situations. For example, the end-user may turn off unnecessary lights or decrease the length of time certain devices will run such as a dryer or a HVAC system from the computer 110.

Further, the consumer may program the computer 110 to automatically manage the rate of power consumption. For example, if the forecast is indicating that the consumer will exceed the baseline level if continued for the entire billing cycle, the end-user might program the computer 110 to automatically raise or lower the temperature on the thermostat a few degrees. This may provide the end-user with the consumption rate of each device and plan use of certain devices accordingly. This may be useful in setting up exact budgets and strictly adhering to them in an automated manner using the computer 110.

In addition, to avoid being charged a premium rate for power consumption, the forecast can allow the end user to fully utilize all of the non-premium power allocated to him. For example, rather than shutting off the HVAC system and enduring an uncomfortable climate, the end user can use the forecast to determine and adjust the thermostat to a certain temperature. The forecast may allow the end user to adjust the temperature so that he can stay under the baseline and yet enjoy a comfortable temperature.

Using the interface 402 provided by the software stored on the computer 110, the end-user may also determine an optimization schedule for running the devices 502. The end-user may obtain data such as cost per hour device used or cost/cycle (washing machine). This may help determine whether the device is properly running as efficient as intended by the manufacturer. Also based on this information, the end-user may program 105 or choose from created device-operating schedules to maximize cost effectiveness and power conservation.

In addition to monitoring and controlling of power-consuming devices, the monitoring device 110 may perform other control functions. For example home security systems and fire alarm systems may be connected. The end-user may control these devices through the interface and program the monitoring device to treat to signals sent by these systems.

Figure 6:
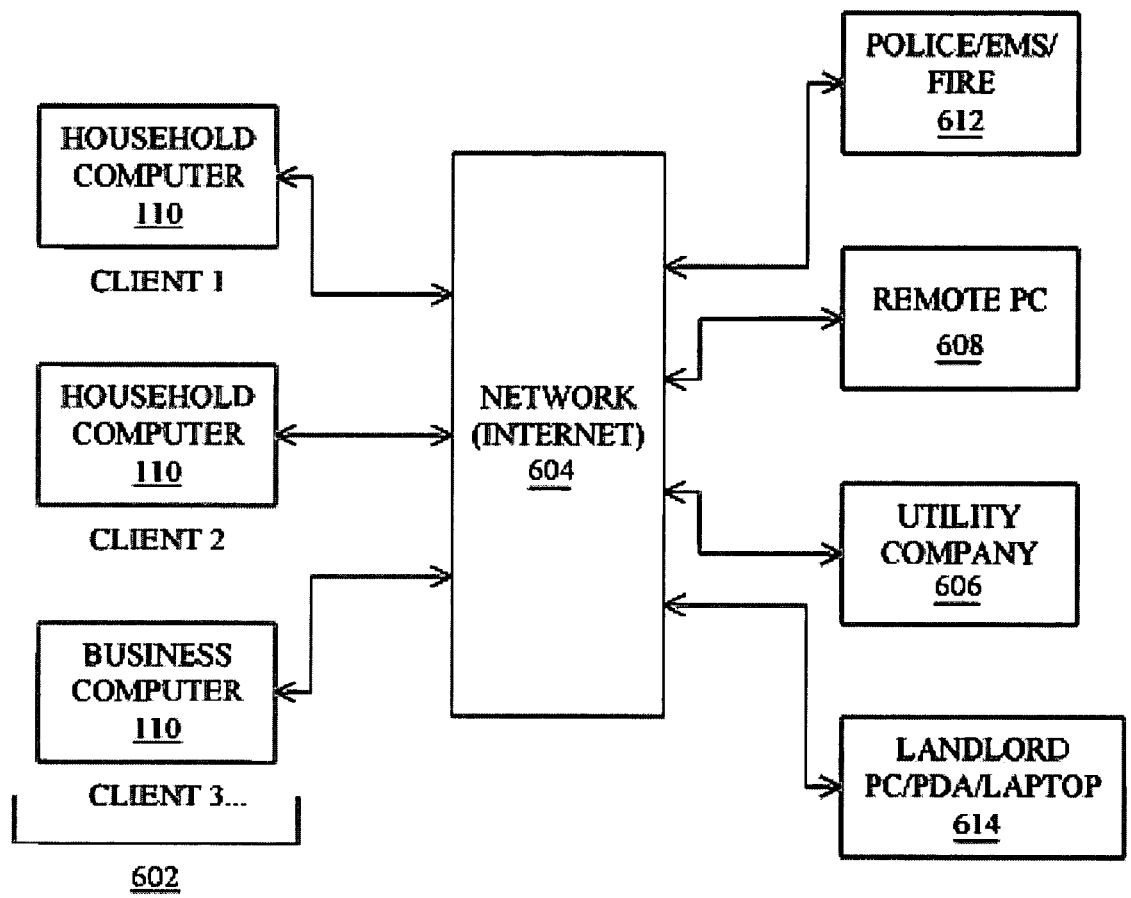
FIG. 6 provides an illustration of the computer connected to a communication system for remote access to the data stored and compiled on the computer.

Illustrated in FIG. 6, the computer 110 may be connected to a communication system 604, such as the Internet. This may allow remote access to the data stored and compiled on the computer 110. By allowing remote access to the data on the computer 110, the end-user may control devices from any location such as a computer at work 608 or from his PDA 610. For example, the end-user may want raise the temperature setting on the thermostat during the hours when he is at work and then remotely lower the temperature of his house before coming home, thus saving significant amounts of electricity use There may be situations when the end-user wants to make sure that no consumption is taking place, when the end-user is on vacation or business trip, for instance. Remote access to consumption information may provide the end-user with information on whether a particular item is being consumed, at what rate it is being consumed, what device is involved and the ability to control that device.

The utility company 606 may also communicate with the computer 110. The utility company 606 may download the monthly consumption information from the Internet and bill the end-user accordingly. In addition the utility company 606 may set up an on-line billing service and thus cut down on costs incurred in mailing the bill. Further, the utility company 606 may be alerted by the computer 110 when the forecast shows that consumption is exceeding its forecast allowable demand. The utility company 606 may then send an alert to households or apartment/office buildings to control the usage during a crisis situation. This alert could be sent via pager, text messaging or other means other means for manual adjustment of consumption. The alert could also be sent for direct control of the consuming devices by the computer 110. In addition, the consumer and utility could agree for the consumer to install a certain version of the program within the computer that manages consuming devices in a manner agreed upon between the parties in such a way that both parties benefit economically while maintaining the integrity of the end user's environment.

Remote access to the data may provide landlords of apartment/commercial buildings with readily available utility cost information. Landlords can provide potential lessees current and historic monthly averages of utility bills from their PDA/computer/laptop 614. Also, landlords may live in locations far from the property they own, possibly in a different state; thus, the landlord may use the data to determine at what rate each tenant is consuming power and directly or, via alert to the consumer, adjust their power use accordingly. Further, landlords may use such information from the computer 110 to automatically adjust or charge for the rent, common area expenses or utility charges accordingly.

By having remote access to control power-consuming devices, the landlord or utility company 606 or, both acting together under contract, might regulate the rate of power consumption while not physically going there. For example, the landlord may control the temperature of the common area of the building from his home computer 614 or even programming the lights to turn off at certain times during the day when sunlight is adequate. The utility company 606 may raise the temperature of thermostats for HVAC systems in summer periods when the power-grid is approaching maximum capacity.

Figure 7:
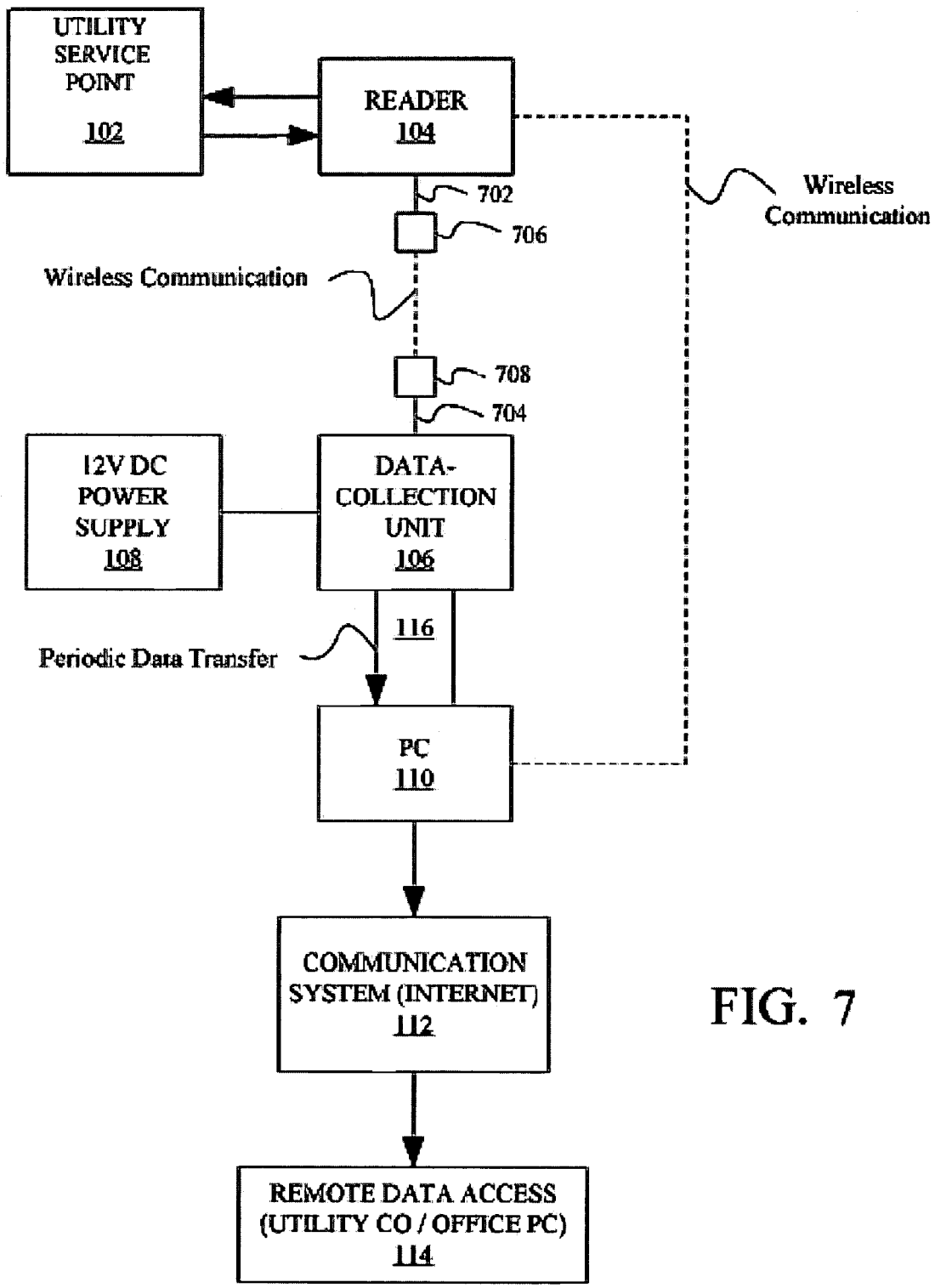
FIG. 7 illustrates an alternative embodiment of the present invention using wireless communication to transmit the data obtained by the reader.

FIG. 7 illustrates an alternative embodiment of the present invention. Unless specifically stated, all elements, of FIG. 7 have a one-to-one functional correspondence with those of FIG. 1. FIG. 9 differs from FIG. 1 in that the data cable 120 (from FIG. 1) that connects the reader 104 and the data-collection unit 106 is replaced with a wireless communication channel. A transmitter 706 for sending wireless communications may be attached to the reader 104 using a shorter serial cable. A receiver 708 may be attached via another shorter serial cable to the data-collection unit 106 for accepting the transmitted communications from the transmitter 706. The transmitter 706 may send data via a wireless carrier frequency, such as 433 MHz, which is standard for garage door openers. It will be apparent, however that another frequency (e.g., 900 MHz, 2.4 GHz, WiFi or others) could be used. The signals sent via the transmitter 706, may be in the format of pulses that are created directly from the intervals of lower levels of reflected light sensed by the sensor 210. Thus, each pulse formed by the reader may result in a pulse at the carrier frequency communicated by the transmitter 706. To communicate the pulse to the data-collection unit 106, the transmitter 706 may send a burst of the carrier frequency to represent each pulse from the output of the reader 104. The wireless signal from the transmitter 706 may be encoded with identification information placed on the carrier frequency to prevent interference from other sources. It will be apparent that a number of different schemes may be used for communicating the data from the reader 104 including WiFi or other wireless means. The transmitter 706 and the receiver 708 may receive operating power from a battery or a wall-mounted AC to DC converter.

Similarly to the embodiment of FIG. 1, the reader 104 may communicate directly with the computer 110. In which case, the receiver and cable 704 may be mounted to the computer 110 rather than the data collection unit 106. In addition, the data collection unit 106 may be omitted.

Wireless communication may be used to help eliminate routing problems when using serial cables such as length of the cable needed and outdoor to indoor routing. The wireless communication device would also be helpful for small businesses in which there are multiple readers which all have to be connected to a monitoring device 110.

While the foregoing has been with reference to particular embodiments of the invention, it will be appreciated by those skilled in the art that changes in these embodiments may be made without departing from the principles and spirit of the invention, the scope of which is defined by the appended claims.

What is claimed is:

1. A method of monitoring and controlling power consumption comprising:
    connecting a current transducer and a voltage wire to an automatic reader to measure power consumption;
    collecting data from one or more readers into a data collection unit;
    transferring the data from one or more readers to a computer system;
    creating a target amount of power consumption for a predetermined period of time wherein the target amount may be any of a group including amperage, amperage hours, kilovolts, kiloyolt hours, watts, watt hours and currency;
    creating a forecast of electric power consumption for the predetermined period of time using the computer system, wherein the computer system is used in the controlling one or more devices based on the forecast so that usage for the predetermined period of time falls below the target amount.

2. The method according to claim 1, wherein said controlling is done manually by hand.
3. The method according to claim 1, wherein said controlling is done manually using the computer system.
4. The method according to claim 1, wherein said controlling is done automatically through the computer system.
5. The method according to claim 1, wherein said predetermined period of time is instantaneous.
6. The method, according to claim 1, wherein said predetermined period of time is a chronological period of time.
7. The method, according to claim 1, wherein said predetermined period of time is a non-chronological period of time.
8. The method according to claim 1, wherein the data obtained from the automatic reader is power consumption data for one or more circuits measured in amperage.
9. The method according to claim 1, wherein the data obtained from the automatic reader is power consumption data for one or more circuits measured in wattage.
10. The method according to claim 1, wherein the data obtained from the automatic reader is power consumption data for one or more circuits measured in kilowatt-hours.
11. The method according to claim 1, wherein the data is transferred from the reader to the computer memory device via wireless communications.
12. The method according to claim 1 wherein the data is transferred from the reader to the computer memory device via wired communications.
13. The method according to claim 1, wherein the data is transferred from the reader to the computer system via wireless communications.
14. The method according to claim 1, wherein the data is transferred from the reader to the computer system via wired communication.
15. The method according to claim 1, wherein the predetermined period of time is two or more instantaneous time periods.
16. The method according to claim 1, wherein the computer system is used to control a security system.
17. The method according to claim 1, wherein the computer system is used to control a fire alarm system.
18. The method according to claim 1 wherein the computer system employs the use of Microsoft Excel Spreadsheet.
19. A system for monitoring and controlling power consumption comprising:
    a current transformer and a voltage wire connected to a reader wherein the reader calculates power consumption data for a power circuit; and,
    a data collection unit to obtain the data from one or more readers and,
    a target amount for power consumption for a predetermined period of time for the power circuit wherein the target amount may be any of a group including amperage, amperage hours kilovolts, kilovolt hours, watts, watt hours and currency; and,
    a computer system for collecting the data from the one or more data collection units wherein the computer system is used in the creation of a forecast of electric power consumption and wherein a device that consumes power is controlled based on the forecast to allow power consumption for the circuit to end the predetermined period of time below the target amount.
20. The system according to claim 19, wherein said controlling is done manually using a computer.
21. The system according to claim 19, wherein said controlling is done automatically through a computer.

22. The system according to claim 19, wherein said predetermined period of time is instantaneous.

23. The system according to claim 19, wherein said predetermined period of time is a chronological period of time.

24. The system according to claim 19, wherein said predetermined period of time is a non-chronological period of time.

25. The system according to claim 19, wherein the data obtained from the automatic reader is power consumption data for one or more circuits measured in amperage.

26. The system according to claim 19 wherein the data obtained from the automatic reader is power consumption for one or more circuits measured in wattage.

27. The system according to claim 19, wherein the data obtained from the automatic reader is power consumption data for one or more circuits measured in kilowatt-hours.

28. The system according to claim 19, wherein the data is transferred from the reader to the computer memory device via wireless communications.

29. The system according to claim 19, wherein the data is transferred from the reader to the computer memory device via wired communications.

30. The system according to claim 19, wherein the data is transferred from the reader to the computer system via wireless communications.

31. The system according to claim 19, wherein the data is transferred from the reader to the computer system via wired communication.

32. The system according to claim 19, wherein the controlling is done manually by hand.

33. The system according to claim 19, wherein the predetermined period of time is two or more instantaneous time periods.

34. The system according to claim 19, wherein the computer system controls a security system.

35. The system according to claim 19, wherein the computer system controls a fire alarm system.

36. The system according to claim 19, responsive to a remote user interface, and operative to control a security system.

37. The system according to claim 19, wherein the computer system employs the use of a Microsoft Excel Spreadsheet.

* * * * *